(12) United States Patent
Kim et al.

(10) Patent No.: US 7,750,342 B2
(45) Date of Patent: Jul. 6, 2010

(54) INSULATING ORGANIC POLYMER, ORGANIC INSULATING LAYER FORMED USING THE INSULATING POLYMER, AND ORGANIC THIN FILM TRANSISTOR COMPRISING THE INSULATING LAYER

(75) Inventors: Joo Young Kim, Suwon-si (KR); Eun Kyung Lee, Seoul (KR); Sang-Yoon Lee, Seoul (KR); Bang Lin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 537 days.

(21) Appl. No.: 11/655,181

(22) Filed: Jan. 19, 2007

(65) Prior Publication Data
US 2008/0067503 A1     Mar. 20, 2008

(30) Foreign Application Priority Data
Sep. 15, 2006    (KR)  ............ 10-2006-0089739

(51) Int. Cl.
*H01L 35/24* (2006.01)
*H01L 51/00* (2006.01)
(52) U.S. Cl. ............... 257/40; 257/E51.001; 438/99

(58) Field of Classification Search ............ 257/40
See application file for complete search history.

(56) References Cited
U.S. PATENT DOCUMENTS
2004/0065929 A1\*   4/2004   Koo et al. .......... 257/410

\* cited by examiner

*Primary Examiner*—Kenneth A Parker
*Assistant Examiner*—Anthony Ho
(74) *Attorney, Agent, or Firm*—Harness, Dickey & Pierce, P.L.C.

(57) ABSTRACT

Disclosed is an insulating organic polymer having side chains that enable the formation of a highly hydrophobic insulating layer with decreased surface energy. Decreased surface energy of an organic insulating layer formed using the insulating organic polymer may lead to an increase in the degree of alignment of a semiconductor material. Therefore, the insulating organic polymer may be used to fabricate an organic thin film transistor having improved characteristics, e.g., decreased threshold voltage and increased charge carrier mobility. Further disclosed are an organic insulating layer formed using the insulating polymer, an organic thin film transistor comprising the insulating layer and a method of fabricating the same, and an electronic device comprising the organic thin film transistor.

20 Claims, 2 Drawing Sheets

INSULATING ORGANIC POLYMER, ORGANIC INSULATING LAYER FORMED USING THE INSULATING POLYMER, AND ORGANIC THIN FILM TRANSISTOR COMPRISING THE INSULATING LAYER

PRIORITY STATEMENT

This application claims priority under 35 U.S.C. §119 to Korean Patent Application No. 10-2006-89739, filed on Sep. 15, 2006, in the Korean Intellectual Property Office (KIPO), the entire contents of which are herein incorporated by reference.

BACKGROUND

1. Field

Example embodiments relate to an insulating organic polymer, an organic insulating layer formed using the insulating polymer, an organic thin film transistor comprising the insulating layer and a method of fabricating the same, and an electronic device comprising the organic thin film transistor. Other example embodiments relate to an insulating organic polymer having side chains which enable the formation of an insulating layer with a decreased surface energy to increase the degree of alignment of a semiconductor material so that the characteristics of an organic thin film transistor comprising the insulating layer are improved, an organic insulating layer formed using the insulating polymer, and an organic thin film transistor comprising the insulating layer and a method of fabricating the same, and an electronic device comprising the organic thin film transistor.

2. Description of the Related Art

Thin film transistors (TFTs) are currently used as switching devices to control the operation of respective pixels and driving devices to operate the pixels in flat panel display devices, e.g., liquid crystal display (LCD) devices and electroluminescence display (ELD) devices. Thin film transistors are also expected to be useful in plastic chips for use in smart cards and inventory tags.

Thin film transistors may include a semiconductor layer having source and drain regions, both of which are doped with higher-concentration impurities, and a channel region formed between the source and drain regions; a gate electrode insulated from the semiconductor layer and positioned in a region corresponding to the channel region; and source and drain electrodes formed in contact with the source and drain regions, respectively.

Inorganic semiconductor materials, e.g., silicon (Si), have been used as materials for channel layers of thin film transistors. However, with increasing demand for the manufacture of larger-area, flexible displays at reduced costs, organic semiconductor materials are currently used as materials for channel layers rather than inorganic semiconductor materials involving increased costs and requiring higher-temperature vacuum processes. Under these circumstances, a number of studies on organic thin film transistors (OTFTs) using an organic film as a semiconductor layer are now being undertaken.

In one example of such an organic thin film transistor, a gate insulating layer may be formed using an inorganic metal oxide, e.g., $Ba_xSr_{1-x}TiO_3$ (barium strontium titanate (BST)), $Ta_2O_5$, $Y_2O_3$ and/or $TiO_2$, or a ferroelectric insulator, e.g., $PbZr_xTi_{1-x}O_3$ (PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$ or $Bi_4Ti_3O_{12}$ by chemical vapor deposition, physical vapor deposition, sputtering and/or sol-gel coating. This organic thin film transistor has been reported to have reduced driving voltage and threshold voltage because it utilizes a high-k dielectric constant (κ) insulating film.

Although the driving voltage of the OTFT may be reduced to some degree, other characteristics (e.g., charge carrier mobility) of the OTFT are still unsatisfactory. Furthermore, because most fabrication processes require an increased temperature of about 200° C. to about 400° C., plastic substrates suitable for use in the manufacture of flexible displays may not be used and common wet processes, e.g., simpler coating and printing, may not be applied to fabricate the devices.

The surface characteristics of an insulating layer in an organic thin film transistor play a critical role in improving the performance of the organic thin film transistor. Thus, a great deal of research has been conducted to increase the charge carrier mobility at the interface between a gate insulating layer and an organic semiconductor layer in an organic thin film transistor and to form a gate insulating layer by simple processes. A decreased surface energy of an insulating layer (e.g. a highly hydrophobic insulating layer) in an organic thin film transistor leads to an increase in the degree of alignment of a semiconductor material constituting an organic semiconductor layer, thus achieving improved performance of the transistor. Some methods have been attempted to increase the mobility of organic thin film transistors by surface treatment of insulating layers. However, the additional surface treatment results in undesirable processability of the insulating layers and incurs considerable processing costs.

SUMMARY

Example embodiments have been made in view of the problems of the related art, and example embodiments provide an insulating organic polymer that may be used to form a highly hydrophobic insulating layer without any additional surface treatment of the insulating layer so that the characteristics of an organic thin film transistor including the insulating layer are improved. Example embodiments provide an organic insulating layer having a decreased surface energy that is formed using the insulating organic polymer. Example embodiments provide an organic thin film transistor having improved characteristics, e.g., increased charge carrier mobility, which includes the organic insulating layer.

In accordance with example embodiments, there is provided an insulating organic polymer represented by Formula 1 below:

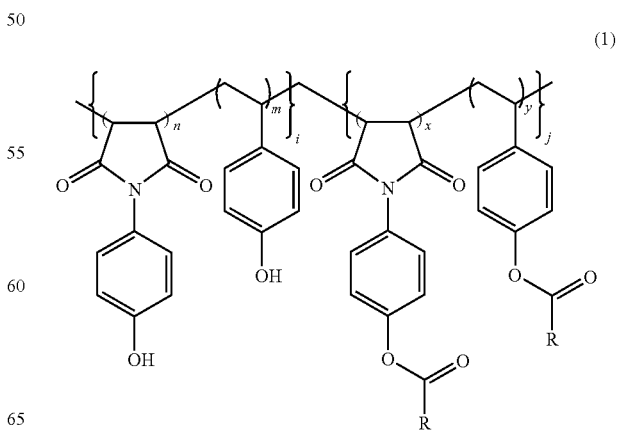

(1)

wherein each R is a substituted or unsubstituted $C_1$-$C_{12}$ alkyl group which contains at least one halogen atom selected from F and Cl, each m and n is a number from about 0.1 to about 0.9, the sum of m and n is 1, each x and y is a number from about 0.1 to about 0.9, the sum of x and y is 1, each i and j is a number from about 0 to about 1, and the sum of i and j is 1, with the proviso that j is not zero.

In accordance with example embodiments, there is provided an organic insulating layer formed using the insulating organic polymer.

In accordance with example embodiments, there is provided an organic thin film transistor comprising a gate electrode, a gate insulating layer, an organic semiconductor layer, and source/drain electrodes formed on a substrate wherein the gate insulating layer is formed using the insulating organic polymer.

In accordance with example embodiments, there is provided a method of fabricating an organic thin film transistor comprising forming a gate electrode, a gate insulating layer, an organic semiconductor layer, and source/drain electrodes on a substrate, wherein the gate insulating layer is formed using the insulating organic polymer represented by Formula 1 below:

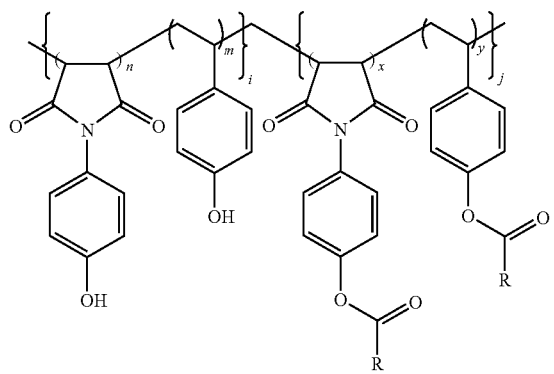

(1)

wherein each R is a substituted or unsubstituted $C_1$-$C_{12}$ alkyl group which contains at least one halogen atom selected from F and Cl, each m and n is a number from about 0.1 to about 0.9, the sum of m and n is 1, each x and y is a number from about 0.1 to about 0.9, the sum of x and y is 1, each i and j is a number from about 0 to about 1, and the sum of i and j is 1, with the proviso that j is not zero.

In accordance with example embodiments, there is provided an electronic device comprising the organic thin film transistor.

BRIEF DESCRIPTION OF THE DRAWINGS

Example embodiments will be more clearly understood from the following detailed description taken in conjunction with the accompanying drawings.

FIG. 1 is a schematic cross-sectional view of a bottom contact organic thin film transistor;

FIG. 2 is a schematic cross-sectional view of a top contact organic thin film transistor; and FIG. 3 is a graph showing the current transfer characteristics of organic thin film transistors fabricated in Examples 1 and 2 of example embodiments.

DETAILED DESCRIPTION OF EXAMPLE EMBODIMENTS

Figure 1:
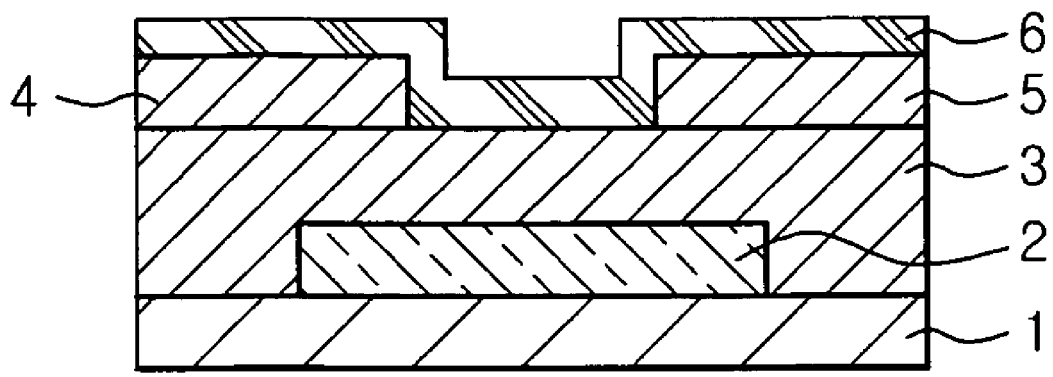
FIGS. 1-3 represent non-limiting, example embodiments as described herein.

Example embodiments will now be described in greater detail with reference to the accompanying drawings. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. In the drawings, the size and relative sizes of layers and regions may be exaggerated for clarity.

It will be understood in the following disclosure of example embodiments, that as used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and combination of the foregoing, but do not preclude the presence and/or addition of one or more other features, integers, steps, operations, elements, components, groups, and combination of the foregoing.

It will be understood that when an element is referred to as being "on" another element, or when an element is referred to as being "disposed between" two or more other elements, it can be directly on (e.g., in at least partial contact with) the other element(s), or an intervening element or elements may be present therebetween. In contrast, when an element is referred to as being "disposed on" another element, the elements are understood to be in at least partial contact with each other, unless otherwise specified. Spatially relative terms, such as "between", "in between" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees, inverted, or at other orientations) and the spatially relative descriptors used herein interpreted accordingly. Likewise, use of the term "opposite", unless otherwise specified, means on the opposing side or surface of the element. For example, where a surface of a layer is said to be opposite another surface or element, it is located on the opposing surface of the layer coplanar with the first surface unless otherwise specified.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments provide an insulating organic polymer represented by Formula 1 below:

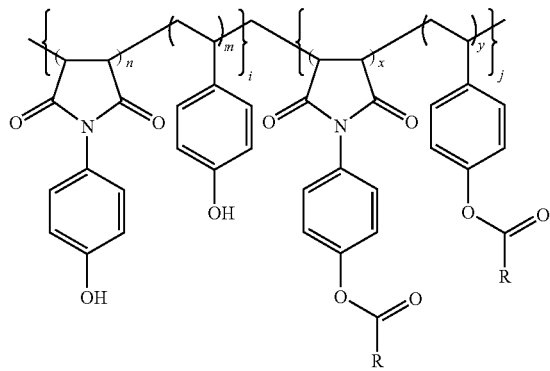

(1)

wherein each R is a substituted or unsubstituted $C_1$-$C_{12}$ alkyl group which contains at least one halogen atom selected from F and Cl, each m and n is a number from about 0.1 to about 0.9, the sum of m and n is 1, each x and y is a number from about 0.1 to about 0.9, the sum of x and y is 1, each i and j is a number from about 0 to about 1, and the sum of i and j is 1, with the proviso that j is not zero.

The insulating organic polymer of example embodiments, wherein m, n, x, y, i and j are within the respective ranges defined in Formula 1, may be used to form an insulating layer having an improved appearance and advantageous effects. An insulating layer may be formed using an insulating organic polymer, wherein m, n, x, y, i and j are out of the respective ranges defined in Formula 1, but may have an undesirable appearance and deteriorated characteristics.

The surface energy of a thin film may be indirectly determined by measuring the contact angle with water. General insulating layers have a contact angle with water of about 60°, while an organic insulating layer formed using the insulating organic polymer of example embodiments has a contact angle with water of about 85° to about 95°. In conclusion, the insulating organic polymer of example embodiments may be used to form an insulating layer having a decreased surface energy, e.g. a highly hydrophobic insulating layer, without any additional surface treatment. In addition, the insulating layer thus formed may be used to improve the performance of an organic thin film transistor using a polymeric semiconductor material.

The insulating organic polymer of Formula 1 may be a polymer represented by Formula 2 below:

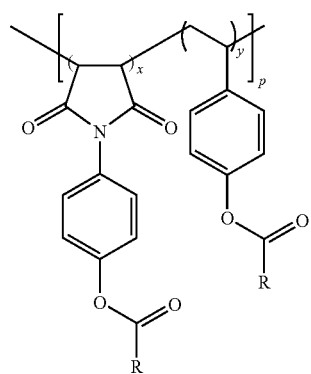

(2)

wherein each R is a substituted or unsubstituted $C_1$-$C_{12}$ alkyl group which contains at least one halogen atom selected from F and Cl, each x and y is a number from about 0.1 to about 0.9, the sum of x and y is 1, and p is a number from about 10 to about 200.

Examples of preferred insulating organic polymers that may be represented by Formula 2 include polymers of Formulae 3 and 4 below:

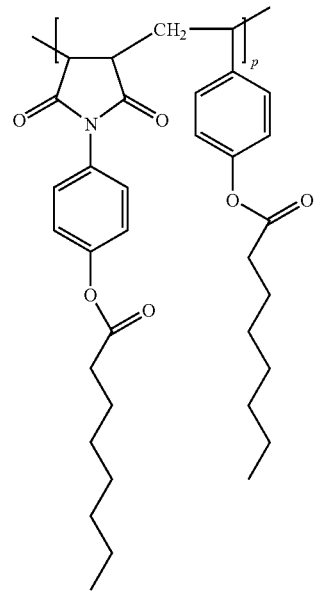

(3)

wherein p is a number from about 10 to about 200; and

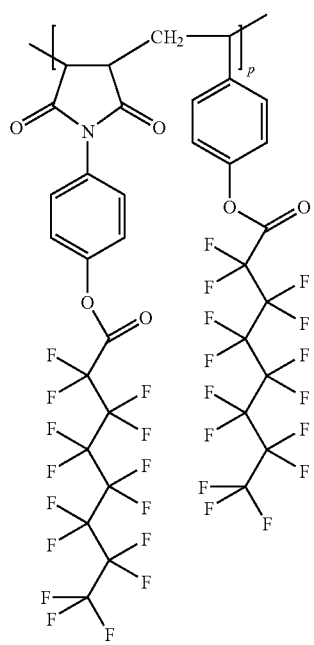

(4)

wherein p is a number from about 10 to about 200.

Because an organic insulating layer formed using the insulating organic polymer of example embodiments is highly hydrophobic, the degree of alignment of a semiconductor material may increase. Accordingly, an organic thin film transistor including the organic insulating layer as a gate insulating layer may have improved characteristics, e.g., increased charge carrier mobility and increased on/off current ratio ($I_{on}/I_{off}$).

Example embodiments provide a composition for forming an organic insulating film which comprises the insulating organic polymer of Formula 1.

The composition of example embodiments may further include a crosslinking agent to increase the degree of crosslinking of the insulating organic polymer. Examples of suitable crosslinking agents that may be used in the composition of example embodiments may include, but are limited to, dipentaerythritol pentaacrylate, dipentaerythritol hexaacrylate, polyethylene glycol diacrylate, and polyethylene glycol dimethacrylate. The crosslinking agent may be used in an amount of about 10% to about 40% by weight, based on the total weight of the composition according to example embodiments.

The composition of example embodiments may further include a solvent. Examples of suitable solvents that may be used in the composition may include the following solvents: aliphatic hydrocarbon solvents, e.g., hexane; aromatic hydrocarbon solvents, e.g., anisole, mesitylene, chlorobenzene, and xylene; ketone-based solvents, e.g., methyl ethyl ketone, 1-methyl-2-pyrrolidinone, cyclohexanone, cyclopentanone and acetone; ether-based solvents, e.g., tetrahydrofuran and isopropyl ether; acetate-based solvents, e.g., ethyl acetate, butyl acetate, and propylene glycol methyl ether acetate; alcohol-based solvents, e.g., isopropyl alcohol and butyl alcohol; amide-based solvents, e.g., dimethylacetamide and dimethylformamide; silicon-based solvents; and mixtures thereof.

The composition of example embodiments may include about 5% to about 15% by weight of the insulating organic polymer, about 10% to about 40% by weight of the crosslinking agent with respect to the weight of the insulating organic polymer, and the balance of the solvent. Because the insulating organic polymer of example embodiments serves to improve the device characteristics of an organic thin film transistor, the insulating organic polymer may be effectively used to fabricate a variety of electronic devices, including liquid crystal display (LCD) devices, photovoltaic devices, organic light-emitting devices (OLEDs), sensors, memory devices and/or integrated circuits. These electronic devices may be fabricated using the insulating organic polymer of example embodiments by any common process known in the art.

Example embodiments provide an organic insulating layer that is formed by coating the composition on a substrate and curing the coated substrate. The coating may be carried out by any conventional wet coating technique, for example, spin coating, dip coating, roll coating, screen coating, spray coating, spin casting, flow coating, screen printing, ink-jet printing and/or drop casting (e.g., spin coating). Upon spin coating, the spin speed may be adjusted within the range of about 400 rpm to about 4,000 rpm.

The curing may be carried out by heating the coated substrate to about 70° C. to about 200° C. for about 30 minutes to about 2 hours. The curing conditions may be varied depending on the kind of insulating organic polymer and the contents of the respective components constituting the composition.

The organic insulating layer of example embodiments may have improved insulating properties. The organic insulating layer of example embodiments may be used to fabricate an organic thin film transistor having increased charge carrier mobility, a decreased driving voltage, a decreased threshold voltage, and an increased on/off current ratio ($I_{on}/I_{off}$). The insulating layer of example embodiments may be formed by a common wet process, e.g., printing and/or spin coating. In addition, the performance of the insulating layer according to example embodiments may be comparable to that of a silicon-based inorganic insulating layer, which is formed only by a complicated technique, e.g., chemical vapor deposition.

Example embodiments provide an organic thin film transistor including the organic insulating layer as a gate insulating layer. The organic thin film transistor of example embodiments may include a substrate, a gate electrode, a gate insulating layer, an organic semiconductor layer, and source/drain electrodes wherein the gate insulating layer may be formed using the insulating organic polymer.

Figure 2:
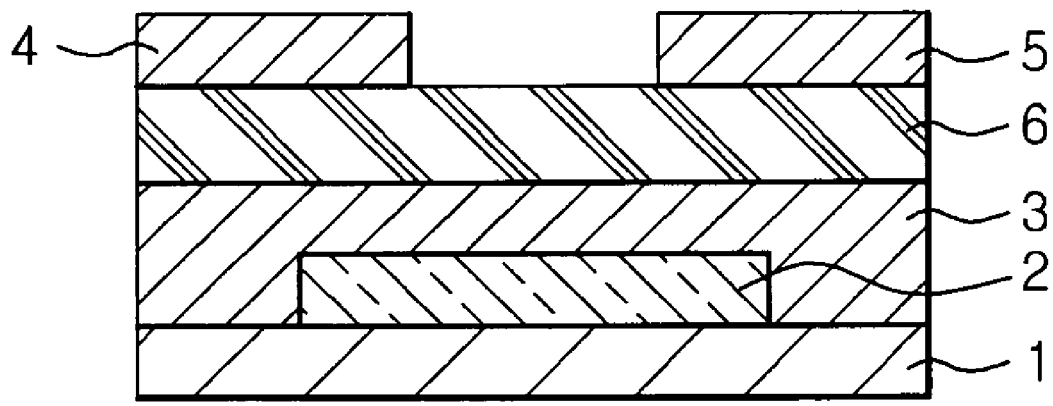

The organic thin film transistor of example embodiments may have any structure, for example, a bottom contact, top contact and/or top gate structure, but is not limited to these structures. Structures of organic thin film transistors that may be fabricated using the insulating organic polymer of example embodiments are illustrated in FIGS. 1 and 2. Specifically, FIG. 1 is a schematic cross-sectional view of a bottom contact organic thin film transistor, and FIG. 2 is a schematic cross-sectional view of a top contact organic thin film transistor.

For example, as shown in FIG. 1, the organic thin film transistor of example embodiments may have a structure in which a gate electrode 2, a gate insulating layer 3, source-drain electrodes 4 and 5, and an organic semiconductor layer 6 are sequentially laminated on a substrate 1. Alternatively, as shown in FIG. 2, the organic thin film transistor of example embodiments may have a structure in which a gate electrode 2, a gate insulating layer 3, an organic semiconductor layer 6, and source-drain electrodes 4 and 5 are sequentially laminated on a substrate 1.

The substrate 1 of the organic thin film transistor according to example embodiments may be a glass substrate and/or a silicon wafer, or may be made of polyethylene terephthalate (PET), polycarbonate (PC), polyethersulfone (PES) and/or polyethylene naphthalate (PEN). Any organic semiconductor material that is commonly used in the art may be used as a material for the organic semiconductor layer 6, and examples thereof may include pentacene, copper phthalocyanine, polythiophene, polyaniline, polyacetylene, polypyrrole, polyphenylene vinylene and derivatives thereof, but are not limited thereto.

Materials for the gate electrode 2 and the source-drain electrodes 4 and 5 may be common metals and electrically conductive polymers. Specific examples of suitable materials for these electrodes may include, but are not limited to, doped silicon (Si), gold (Au), silver (Ag), aluminum (Al), copper (Cu), nickel (Ni), chromium (Cr), molybdenum (Mo), tungsten (W) and/or indium tin oxide (ITO). Each of the electrodes may be formed by washing the substrate 1 to remove impurities present thereon, depositing the corresponding metal on the clean substrate by a common technique, e.g., chemical vapor deposition, plasma chemical vapor deposition and/or sputtering, and patterning the deposited metal.

Example embodiments provide an electronic device including the organic thin film transistor. The fabrication of the organic thin film transistor according to example embodiments may be simplified, thus avoiding inconvenience in processing (e.g., surface treatment) of an insulating layer. In addition, the organic thin film transistor of example embodiments may exhibit improved characteristics, e.g., decreased threshold voltage and increased on/off current ratio. Therefore, the organic thin film transistor of example embodiments may be useful for the fabrication of a variety of electronic devices, including liquid crystal display (LCD) devices, photovoltaic devices, organic light-emitting devices (OLEDs), sensors, memory devices and/or integrated circuits.

Hereinafter, example embodiments will be explained in more detail with reference to the following examples. However, these examples are given for the purpose of illustration only and are not intended to limit example embodiments.

EXAMPLES

Preparative Example 1

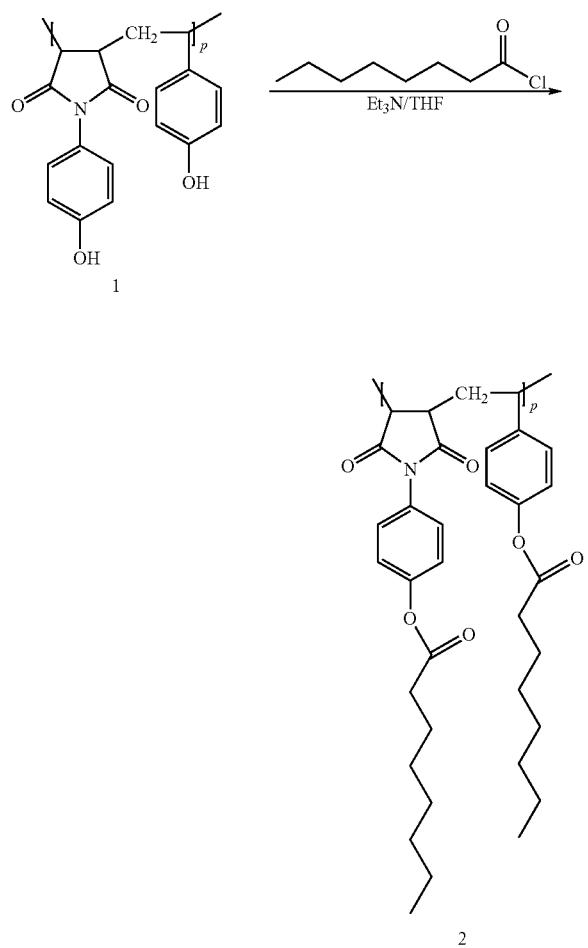

About 1.5 g (about 4.85 mmol, about 0.42 eq.) of the (poly(hydroxyphenyl maleimide-co-hydroxystyrene)) 1 (p=200) was dissolved in about 20 ml of tetrahydrofuran (THF) under a nitrogen atmosphere. After the solution was cooled to about 0° C., about 1.77 g (about 17.46 mmol, about 1.5 eq.) of triethylamine was added thereto and stirred for about one hour. To the mixture was added about 1.893 g (11.64 mmol, 1.0 eq.) of octanoyl chloride at about 0° C. The resulting mixture was allowed to warm to room temperature and stirred for one day. The reaction solution was poured into a mixture of methanol and water to obtain a precipitate. The precipitate was filtered and extracted with methanol to yield the insulating organic polymer 2 (about 1.5 g, yield=about 52%) as a white solid.

Preparative Examle 2

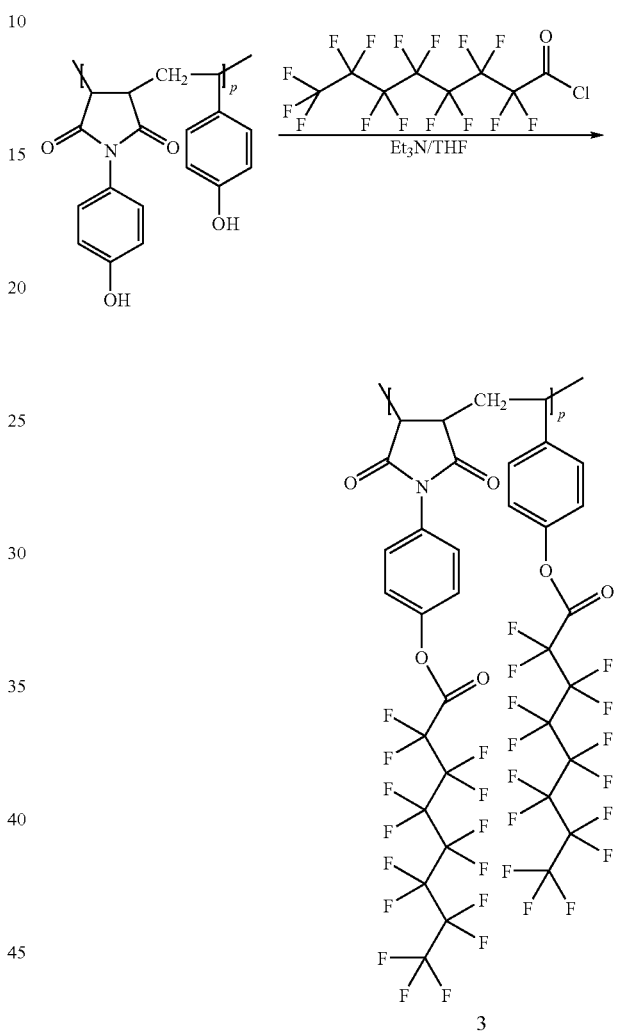

About 1.5 g (about 4.85 mmol, about 0.42 eq.) of the (poly(hydroxyphenyl maleimide-co-hydroxystyrene)) 1 (p=200) was dissolved in 20 ml of tetrahydrofuran (THF) under a nitrogen atmosphere. After the solution was cooled to about 0° C., about 1.77 g (about 17.46 mmol, about 1.5 eq.) of triethylamine was added thereto and stirred for about one hour. To the mixture was added about 5.034 g (about 11.64 mmol, about 1.0 eq.) of perfluorooctanoyl chloride at about 0° C. The resulting mixture was allowed to warm to room temperature and stirred for one day. The reaction solution was poured into a mixture of methanol and water to obtain a precipitate. The precipitate was filtered and extracted with methanol to yield the insulating organic polymer 3 (about 2.5 g, yield=about 46%) as a white solid.

Example 1

Fabrication of Organic Thin Film Transistor

Aluminum (Al) was deposited on a clean glass substrate by vacuum evaporation to form an about 2,000 Å-thick gate electrode.

A solution of the insulating organic polymer (about 10 wt %) prepared in Preparative Example 1 in cyclohexanone was spin-coated on the gate electrode and the substrate, and annealed at about 150° C. for about one hour to form a gate insulating layer having a thickness of about 500 nm to about 1,000 nm.

A solution of a polythiophene-based semiconductor material (about 1 wt %) in chloroform was spin-coated to a thickness of about 50 nm to about 100 nm, and annealed at about 100° C. for about 10 to about 60 minutes to form an organic semiconductor layer. Gold (Au) was deposited on the organic semiconductor layer by vacuum evaporation using a shadow mask (channel length: about 100 µm, channel width: about 1 mm) to form source-drain electrodes, completing the fabrication of an organic thin film transistor.

Figure 3:
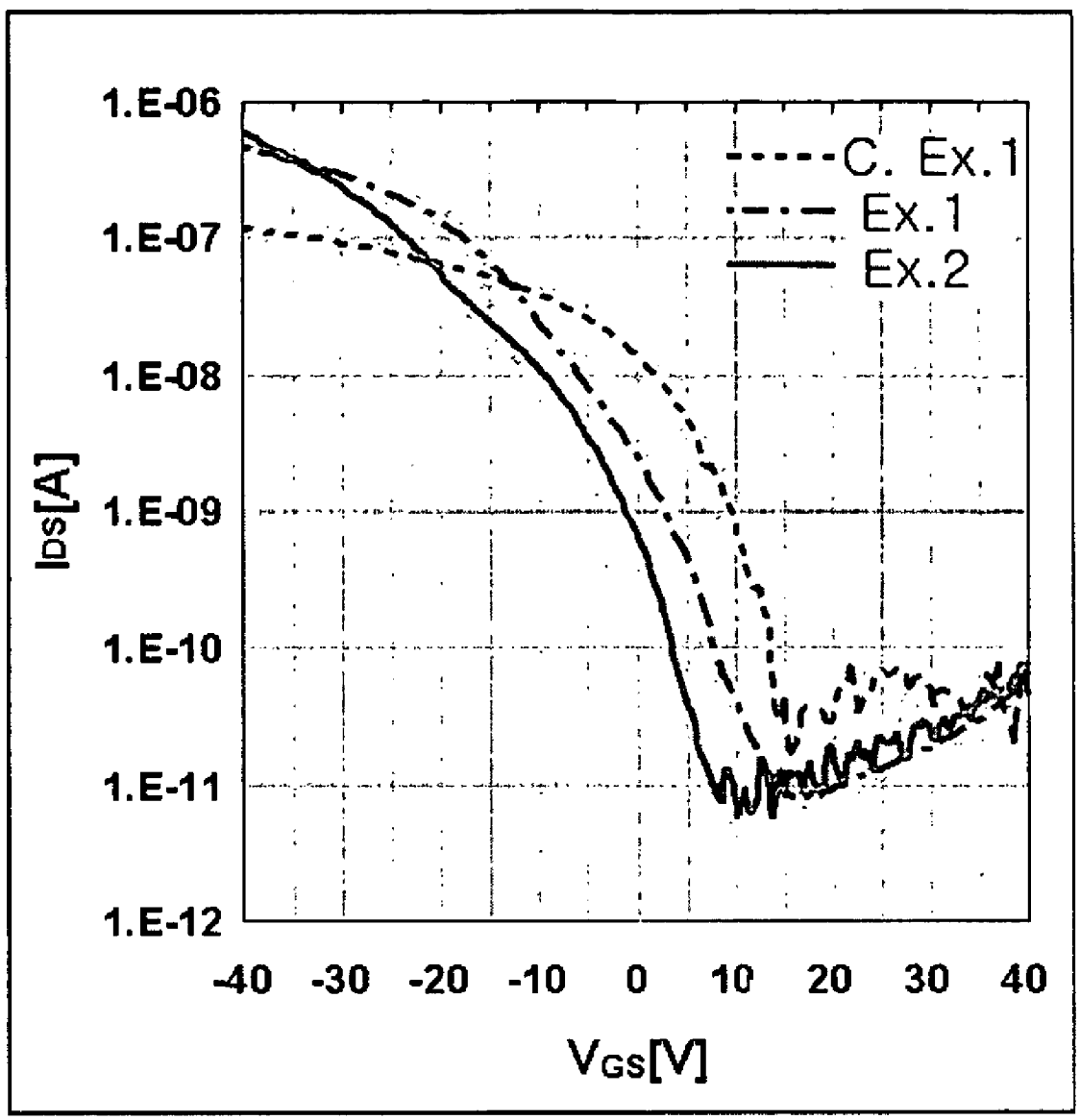

The current transfer characteristics of the organic thin film transistor were evaluated using a semiconductor characterization system (4200-SCS, KEITHLEY). The obtained results are plotted in FIG. 3. From the curve, the charge carrier mobility and on/off current ratio of the organic thin film transistor were calculated by the following current equations in the saturation regime.

1) Charge Carrier Mobility

The charge carrier mobility was calculated from the slope of a graph representing the relationship between $(I_{SD})^{1/2}$ and $V_G$, which was plotted from the following current equations in the linear regime:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$: source-drain current, $\mu$ and $\mu_{FET}$: charge carrier mobility, $C_O$: capacitance of oxide film, W: channel width, L: channel length, $V_G$: gate voltage, and $V_T$: threshold voltage.

Thereafter, the threshold voltage ($V_{th}$) was obtained from the intersection between the $V_G$ axis and the extension line of the linear portion in the graph of $(I_{SD})^{1/2}$ versus $V_G$. As the absolute value of the threshold voltage approximates to zero, the consumption of electrical power decreases.

2) On/Off Current Ratio ($I_{on}/I_{off}$)

The $I_{on}/I_{off}$ ratio was determined from a ratio of a maximum current in the on-state to a minimum current in the off-state. The $I_{on}/I_{off}$ ratio is represented by the following equation:

$$\frac{I_{on}}{I_{off}} = \left(\frac{\mu}{\sigma}\right)\frac{C_o^2}{qN_A t^2}V_D^2$$

wherein $I_{on}$: maximum current, $I_{off}$: off-state leakage current, u: charge carrier mobility, σ: conductivity of thin film, q: electric charge, $N_A$: electric charge density, t: thickness of semiconductor film, $C_0$: capacitance of oxide film, and $V_D$: drain voltage.

As may be seen from this equation, the larger the dielectric constant and the smaller the thickness of the dielectric film, the higher the $I_{on}/I_{off}$ ratio. Therefore, the kind and thickness of the dielectric film are crucial factors in determining the $I_{on}/I_{off}$ ratio. The off-state leakage current ($I_{off}$), which is a current flowing in the off-state, was determined from the minimum current in the off-state.

Example 2

An organic thin film transistor was fabricated in the same manner as in Example 1, except that the insulating organic polymer prepared in Preparative Example 2 was used. The characteristics of the transistor were evaluated by the same procedures as described in Example 1, and the results are shown in Table 1 and FIG. 3.

Comparative Example 1

An organic thin film transistor was fabricated in the same manner as in Example 1, except that the (polyhydroxymaleimide-polyhydroxystyrene) (poly(hydroxyphenyl maleimide-co-hydroxystyrene)) was used as a material for an organic gate insulating layer. The characteristics of the transistor were evaluated by the same procedures as described in Example 1, and the results are shown in Table 1 and FIG. 3.

TABLE 1

| Example No. | Charge carrier mobility (cm²/Vs) | $I_{on}/I_{off}$(-40 V) | $V_{th}$ (V) |
|---|---|---|---|
| Example 1 | 0.040 | $5.9 \times 10^4$ | -11 |
| Example 2 | 0.080 | $1.2 \times 10^5$ | -15 |
| Comparative Example 1 | 0.008 | $7.2 \times 10^3$ | +4 |

As may be seen from the data shown in Table 1, the organic thin film transistor (Comparative Example 1) fabricated using the (polyhydroxymaleimide-polyhydroxystyrene) (poly(hydroxyphenyl maleimide-co-hydroxystyrene)) with no functional group in the side chains had a charge carrier mobility of about 0.008 cm²/V.s. In contrast, the organic thin film transistor (Example 2) fabricated using the novel insulating organic polymer of example embodiments having functional groups, which enables the surface energy of the insulating layer to be lowered, in the side chains had a charge carrier mobility of about 0.08 cm²/V.s, thus achieving increased on/off current ratio.

As is apparent from the above description, the insulating organic polymer of example embodiments may be used to form an organic insulating layer having a decreased surface energy, thereby increasing the degree of alignment of a semiconductor material. Therefore, the insulating organic polymer of example embodiments may be advantageously used to fabricate an organic thin film transistor having improved characteristics, e.g., increased charge carrier mobility and increased on/off current ratio. In addition, the insulating organic polymer of example embodiments may be used to form an insulating layer having a decreased surface energy by a simpler process, e.g., spin coating, even without any additional surface treatment of the insulating layer, thereby achieving improved processability of the insulating layer.

Example embodiments have been described herein with reference to its preferred embodiments. These embodiments are set forth for illustrative purposes only and those skilled in the art will appreciate that various modifications and equivalents may be made to the preferred embodiments. Therefore, the scope of example embodiments will be defined only by the technical spirit of the claims that follow.

What is claimed is:

1. An insulating organic polymer represented by Formula 1 below:

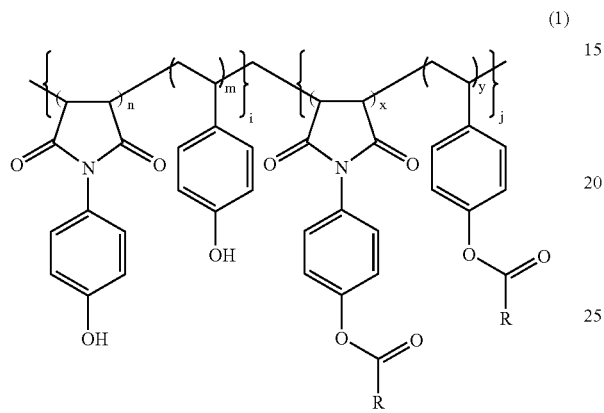

(1)

wherein each R is a substituted or unsubstituted $C_1$-$C_{12}$ alkyl group which contains at least one halogen atom selected from F and Cl, each m and n is a number from about 0.1 to about 0.9, the sum of m and n is 1, each x and y is a number from about 0.1 to about 0.9, the sum of x and y is 1, each i and j is a number from about 0 to about 1, and the sum of i and j is 1, with the proviso that j is not zero.

2. The insulating organic polymer according to claim 1, wherein the insulating organic polymer is a polymer of Formula 2 below:

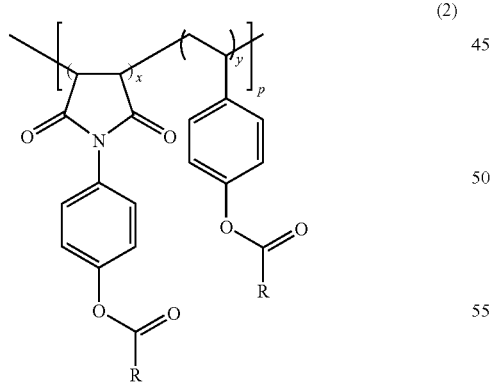

(2)

wherein each R is a substituted or unsubstituted $C_1$-$C_{12}$ alkyl group which contains at least one halogen atom selected from F and Cl, each x and y is a number from about 0.1 to about 0.9, the sum of x and y is 1, and p is a number from about 10 to about 200.

3. The insulating organic polymer according to claim 2, wherein the insulating organic polymer of Formula 2 is a polymer of Formula 3 or 4 below:

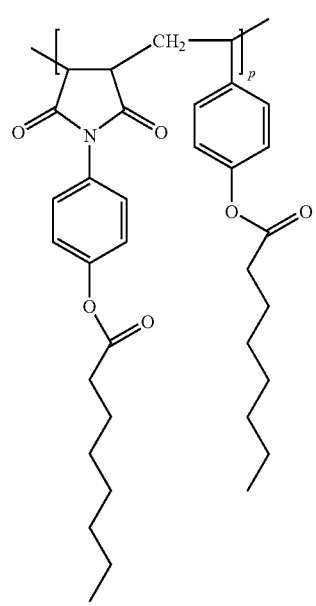

(3)

wherein p is a number from about 10 to about 200; and

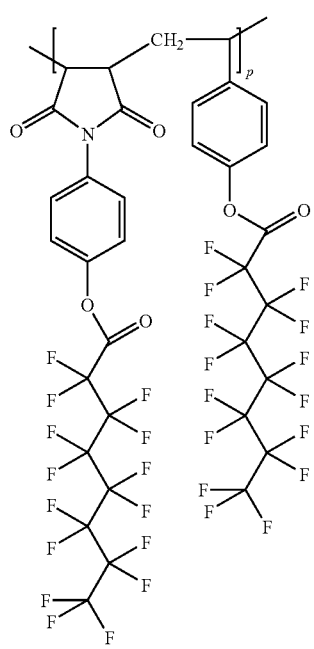

(4)

wherein p is a number from about 10 to about 200.

4. A composition for forming an organic insulating film, comprising the insulating organic polymer of claim 1.

5. The composition according to claim 4, further comprising:
at least one crosslinking agent selected from the group consisting of dipentaerythritol pentaacrylate, dipentaerythritol hexaacrylate, polyethylene glycol diacrylate, and polyethylene glycol dimethacrylate.

6. The composition according to claim 5, wherein the composition includes about 5% to about 15% by weight of the insulating organic polymer, about 10% to about 40% by weight of the crosslinking agent with respect to the weight of the insulating organic polymer, and the balance of a solvent.

7. The composition according to claim 6, wherein the solvent is selected from the group consisting of aliphatic hydrocarbon solvents, aromatic hydrocarbon solvents, ketone-based solvents, ether-based solvents, acetate-based solvents, alcohol-based solvents, amide-based solvents, silicon-based solvents, and mixtures thereof.

8. An organic insulating layer formed from the composition according to claim 4.

9. The organic insulating layer according to claim 8, wherein the insulating layer is formed by spin coating, dip coating, roll coating, screen coating, spray coating, spin casting, flow coating, screen printing, ink-jet printing, or drop casting.

10. An organic thin film transistor comprising a gate electrode, a gate insulating layer, an organic semiconductor layer, and source/drain electrodes formed on a substrate wherein the gate insulating layer is formed using the insulating organic polymer according to claim 1.

11. The organic thin film transistor according to claim 10, wherein the organic semiconductor layer is formed of a material selected from the group consisting of pentacene, copper phthalocyanine, polythiophene, polyaniline, polyacetylene, polypyrrole, polyphenylene vinylene, and derivatives thereof.

12. The organic thin film transistor according to claim 10, wherein each of the gate electrode and the source-drain electrodes is made of a material selected from the group consisting of doped silicon (Si), gold (Au), silver (Ag), aluminum (Al), copper (Cu), nickel (Ni), chromium (Cr), molybdenum (Mo), tungsten (W), and indium tin oxide (ITO).

13. The organic thin film transistor according to claim 10, wherein the substrate is a glass substrate or a silicon wafer, or is made of polyethylene terephthalate (PET), polycarbonate (PC), polyethersulfone (PES) or polyethylene naphthalate (PEN).

14. The organic thin film transistor according to claim 10, wherein the organic thin film transistor has a bottom contact, top contact or top gate structure.

15. An electronic device comprising the organic thin film transistor according to claim 10.

16. The electronic device according to claim 15, wherein the electronic device is a liquid crystal display (LCD) device, a photovoltaic device, an organic light-emitting device (OLED), a sensor, a memory device, or an integrated circuit.

17. A method of fabricating an organic thin film transistor comprising:
   forming a gate electrode, a gate insulating layer, an organic semiconductor layer, and source/drain electrodes on a substrate, wherein the gate insulating layer is formed using the insulating organic polymer represented by Formula 1 below:

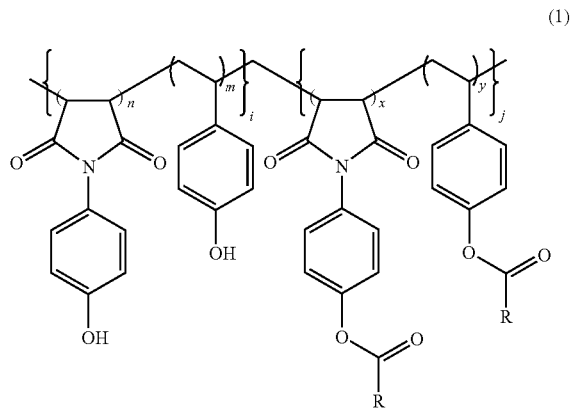

(1)

wherein each R is a substituted or unsubstituted $C_1$-$C_{12}$ alkyl group which contains at least one halogen atom selected from F and Cl, each m and n is a number from about 0.1 to about 0.9, the sum of m and n is 1, each x and y is a number from about 0.1 to about 0.9, the sum of x and y is 1, each i and j is a number from about 0 to about 1, and the sum of i and j is 1, with the proviso that j is not zero.

18. The method according to claim 17, wherein forming the organic semiconductor layer includes forming a material selected from the group consisting of pentacene, copper phthalocyanine, polythiophene, polyaniline, polyacetylene, polypyrrole, polyphenylene vinylene, and derivatives thereof.

19. The method according to claim 17, wherein each of the gate electrode and the source-drain electrodes is made of a material selected from the group consisting of doped silicon (Si), gold (Au), silver (Ag), aluminum (Al), copper (Cu), nickel (Ni), chromium (Cr), molybdenum (Mo), tungsten (W), and indium tin oxide (ITO).

20. The method according to claim 17, wherein the organic thin film transistor has a bottom contact, top contact or top gate structure.

* * * * *